United States Patent [19]
Kyuma

[11] Patent Number: 4,737,832
[45] Date of Patent: Apr. 12, 1988

[54] OPTICAL SIGNAL PROCESSOR

[75] Inventor: Kenji Kyuma, Kawasaki, Japan

[73] Assignee: Canon Kabushiki Kaisha, Tokyo, Japan

[21] Appl. No.: 842,241

[22] Filed: Mar. 21, 1986

[30] Foreign Application Priority Data

Apr. 1, 1985 [JP] Japan .................. 60-68671

[51] Int. Cl.$^4$ .............. H01L 27/14; H01L 29/78; H01L 27/02
[52] U.S. Cl. ...................... 357/30; 357/43; 357/34; 357/23.1
[58] Field of Search ............. 357/30, 43, 34, 30 G, 357/30 H, 30 I, 30 L, 30 P, 30 S, 24 LR, 23.1

[56] References Cited
U.S. PATENT DOCUMENTS

| | | | |
|---|---|---|---|
| 4,407,010 | 9/1983 | Baji et al. | 358/213 |
| 4,408,304 | 10/1983 | Nishizawa et al. | 365/174 |
| 4,445,130 | 4/1984 | Poulain et al. | 357/16 |
| 4,686,554 | 8/1987 | Ohmi et al. | 357/40 |

FOREIGN PATENT DOCUMENTS 56-150878 11/1981 Japan .
56-157073 12/1981 Japan .
56-165473 12/1981 Japan .

OTHER PUBLICATIONS

*IBM Tech. Discl. Bulletin* vol. 19, No. 11, Apr. 1977 S. G. Chamberlain.

Primary Examiner—Martin H. Edlow
Assistant Examiner—D. Featherstone
Attorney, Agent, or Firm—Fitzpatrick, Cella, Harper & Scinto

[57] ABSTRACT

An optical signal processor which comprises a phototransistor for receiving optical signals and an input for receiving external electrical signals, a plurality of base regions connected, respectively, to the phototransistor and the input, for accumulating charges corresponding to the optical signals and the external electrical signals, and a gate electrically coupled thereto an insulating layer to the base regions to control the transfer of charges between them so as to permit mixing of optical and external electrical signals.

13 Claims, 6 Drawing Sheets

OPTICAL SIGNAL PROCESSOR

BACKGROUND OF THE INVENTION

1. Field of the Invention

The present invention relates to an optical signal processor and, more particularly, to an improved photoelectric transducer.

2. Description of the Related Art

Figure 1A:
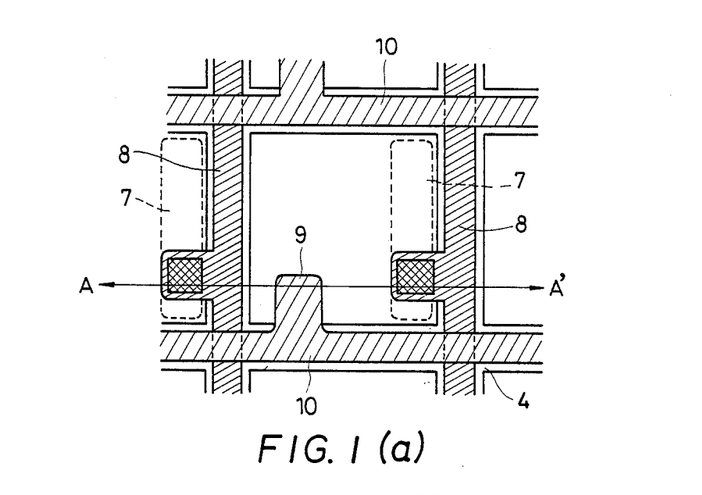
FIG. 1(a) is a plan view of a photosensor cell.
Figure 1B:
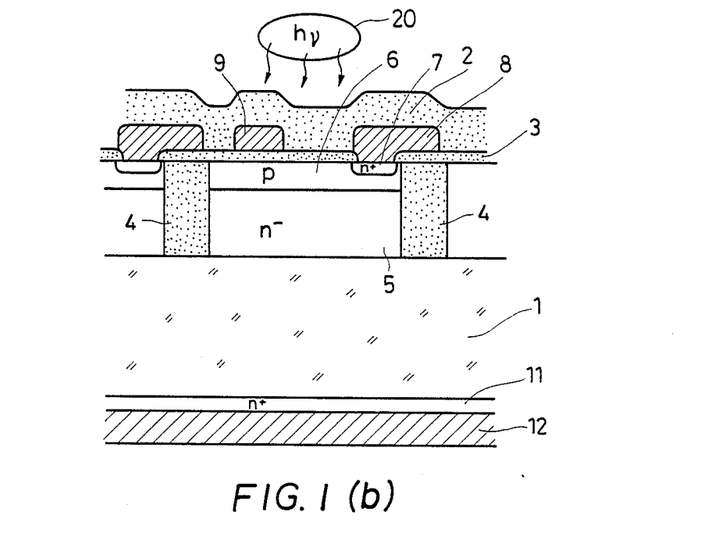
FIG. 1(b) is a sectional view taken along the line A—A' in FIG. 1(a)
Figure 2:
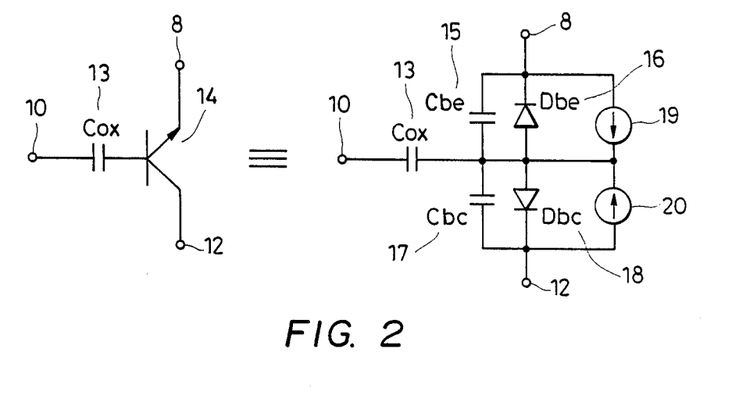
FIG. 2 is a diagram showing an equivalent circuit of the photosensor cell shown in FIG. 1(a)

FIG. 1(a) is a plan view of a photosensor cell which serves as a photoelectric transducer, while FIG. 1(b) is a sectional view taken along the line A—A' in FIG. 1(a), and FIGS. 2a and 2b and equivalent circuits of the photosensor cell. In these figures, the same members or portions or those which are equivalent to each other are denoted by the same reference numerals.

Although the photosensor cell shown in FIGS. 1a and 1b is arranged so that picture elements which are adjacent to each other are lined up in columns and rows, it is, of course, possible to dispose these picture elements so that the elements in each row are offset from their counterparts in adjacent rows (i.e., interpolation arrangement) in order to increase resolution in the horizontal direction.

The structure of this photosensor cell is as follows:

As shown in FIGS. 1(a) and 1(b), various layers, regions, etc., such as those mentioned below are formed on an n-type silicon subtrate 1 to form the photosensor cell: a passivation layer 2; an insulating oxide layer 3 constituted by a silicon oxide layer; element-isolating regions 4 constituted by an insulating layer or a polysilicon layer for electrically insulating photosensor cells which are adjacent to each other; an $n^-$-region 5 of low impurity concentration which is formed by the epitaxial technique or other similar means; a p-region 6 which constitutes the base of a bipolar transistor; an $n^+$-region 7 which constitutes the emitter of the bipolar transistor; an electrode 8 formed of an electrically conductive material, e.g., aluminum (Al), for reading out a signal to an external device; a capacitor electrode 9 facing the p-region 6 across the insulating layer 3 and employed to apply pulses to the p-region 6 which is in a floating state; an electrode 10 connected to the capacitor electrode 9; an $n^+$-region 11 formed on the reverse surface of the substrate 1 for forming an ohmic contact; and an electrode 12 for applying a potential to the collector of the bipolar transistor.

Referring to FIG. 2a, which shows an equivalent circuit of the above-described photosensor cell, a capacitor Cox13 has an MOS (metal oxide semiconductor) structure which is constituted, as shown in FIG. 1b, by the electrode 9, the insulating layer 3 and the p-region 6, and a bipolar transistor 14 is constituted, as shown in FIG. 1b, by the $n^+$-region 7 which serves as the emitter, the p-region 6 as the base, and the $n^-$-region 5 and the region 1 as the collector. As will be clear from these figures, the p-region 6 is a floating region.

The bipolar transistor 14 may be represented by an equivalent circuit which is shown in FIG. 2b and is constituted by a base-emitter junction capacitance Cbe15, a base-emitter pn junction diode Dbe16, a base-collector junction capacitance Cbc17, a base-collector pn junction diode Dbc18 and current sources 19 and 20.

The following is a description of the basic operation of the photosensor cell having the above-described structure.

The basic operation of the photosensor cell includes a charge-accumulating operation during irradiation with light, a reading operation and a refreshing operation. In the charge-accumulating operation, for example, the emitter is grounded through the electrode 8, and the collector is biased to a positive potential through the electrode 12. The base is assumed to be reverse-biased with respect to the emitter.

In this state, when light 20 infringes upon the photosensor cell from the obverse side thereof, as shown in FIG. 1(b), electron-hole pairs are generated within the semiconductor. In the electron-hole pairs, the electrons flow out toward the n-region 1 since it is biased to a positive potential, but the holes are gradually accumulated in the p-region 6. The accumulation of holes in the p-region 6 causes the potential of the p-region 6 to change gradually toward positive. At this time, the potential Vp generated at the p-region 6 (which is the base) by the accumulation of the holes excited by the incident light may be given by $Vp = Q/C$, where Q represents the amount of charges (holes in this case) accumulated in the base, and C represents the total junction capacitance of the capacitances Cbe15 and Cbc17.

It is to be noted here that, as the cell size is reduced as a result of an increase in resolution of the device, the quantity of light incident on each photosensor cell is reduced, and the amount of accumulated charge Q is also decreased; however, since the junction capacitance also decreases in proportion to the reduction in cell size, the potential Vp generated by the incidence of light is maintained at a substantially constant level. This is because the photosensor cell has an extremely simple structure, as shown in FIG. 1, and this makes it possible to obtain a remarkably large effective light-sensitive or light-receiving area.

The following is a description of the operation of reading out the voltage generated by the charges thus accumulated in the p-region 6.

In a reading operation, the emitter and the electrode 8 are left floating, and the collector is held at a positive potential Vcc.

Assuming now that the potential at the p-region or base 6 when biased to a negative potential before the irradiation with light is represented by $-Vb$, and the accumulated charge voltage generated by the irradiation is represented by Vp, the base potential at the time when a reading operation is to be effected is $-Vb+Vp$. When, in this state, a positive voltage Vr for reading is applied to the electrode 9 through the electrode 10, this positive voltage Vr is capacitance-divided by the oxide layer capacitance Cox13, the base-emitter junction capacitance Cbe15 and the base-collector junction capacitance Cbc17, and the base potential becomes as follows:

$$Vb + Vp + \frac{Cox}{Cox + Cbe + Cbc} Vr.$$

If this base potential is forward-biased excessively by Vbs which is represented by the following equation:

$$-Vb + \frac{Cox}{Cox + Cbe + Cbc} Vr = Vbs;$$

then, the base potential is forward-biased more than the accumulated charge voltage Vp generated by the irradiation with light. In consequence, electrons are injected into the base from the emitter, and since the collector potential is positive, the injected electrons are accelerated by the drift field so as to reach the collector.

Figure 3:
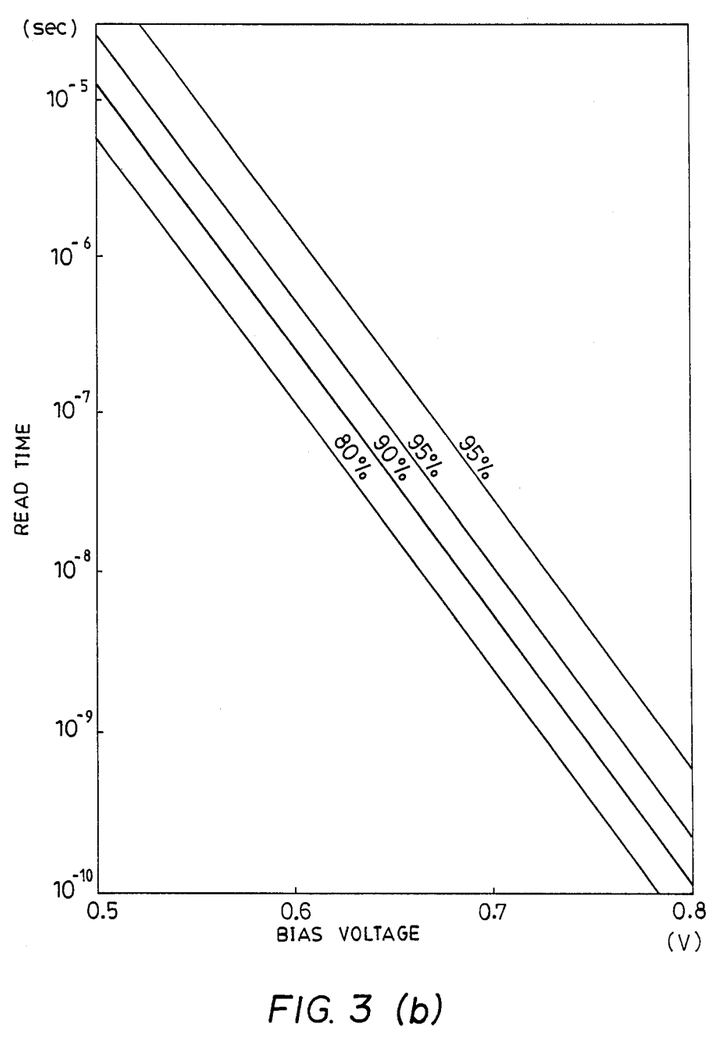
FIG. 3(a) is a graph showing the relationship between the accumulated charge voltage Vp and the read voltage when the bias voltage Vbs is 0.6 V.
FIG. 3(b) is a graph showing the relationship between the bias voltage Vbs and the read time.
Figure 3A:
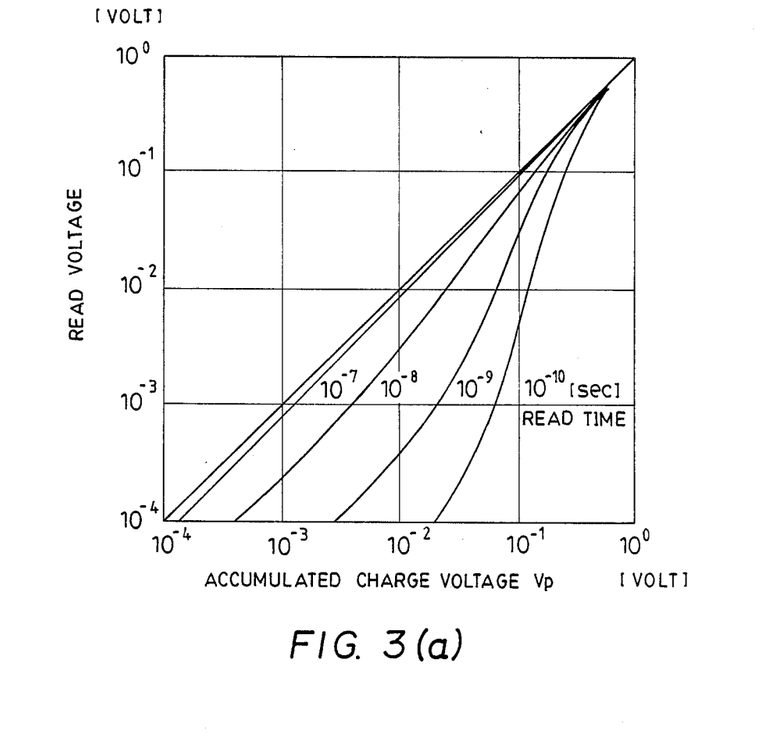

FIG. 3(a) is a graph showing the relationship between the read voltage and the accumulated charge voltage Vp when Vbs=0.6 V.

As will be understood from the graph, if the read time (a period of time during which the read voltage Vr is being applied to the capacitor electrode 9) is set at about 100 nsec (nanoseconds) or more, the linear relationship between the accumulated charge voltage Vp and the read voltage is ensured within a range of about four decimal places, and high-speed reading operation is possible. In the above-described calculation example, the capacitance of the electrode 8 is 4 pF (picofarads), and the total junction capacitance Cbe+Cbc is 0.014 pF, which means the capacitance ratio is about 300:1. In this case, however, the voltage Vp generated in the p-region or base 6 is not attenuated at all, and a reading operation effected at extremely high speed is made possible by the effect of the bias voltage Vbs. This is because the amplifying function of the photosensor cell works effectively. Thus, since the output voltage is favorably large, the level of fixed pattern noise and that of random noise attributable to the output capacity become small relatively, and it is therefore possible to obtain a signal of remarkably excellent S/N (signal to noise) ratio.

FIG. 3(b) is a graph showing the relationship between the read time, the bias voltage Vbs, and the linear relationship between the accumulated charge voltage and the read voltage which has been described above: namely, excellent linearity on the order of four decimal places can be obtained within a high-speed read time of about 100 nsec when the bias voltage Vbs is set at 0.6 V.

It is possible, according to the graph shown in FIG. 3(b), to ascertain the read time required for the read voltage which depends on the bias voltage Vbs to reach a desired ratio (%) with respect to the accumulated charge voltage. Accordingly, when the read time and the required linearity are determined from the overall design of a particular image sensor, the required bias voltage Vbs can be determined using the graph shown in FIG. 3(b).

Another advantage of the photosensor cell having the above-described arrangement is that it is possible to read out the holes accumulated in the p-region or base 6 in a non-destructive manner because of the extremely small probability of the electrons and holes in the p-region 6 recombining with each other. This means that it is possible to provide a novel function in terms of the system operation when the photosensor cell of the above-described arrangement is employed to constitute an image sensor.

The accumulated charge voltage Vp can be held in the p-region or base 6 for a remarkably long period of time, but the maximum holding time is limited by the dark current which is thermally generated in a depletion layer at the junction. In the above-described photosensor cell, however, the depletion layer extends in the region 5 which has an extemely low impurity concentration; therefore, the number of electron-hole pairs thermally generated therein is favorably small by virtue of its excellent crystallizability.

The operation of refreshing the p-region 6 by destroying the charges already accumulated therein will be described below.

In a photosensor cell of the above-described arrangement, the charges accumulated in the p-region 6 do not disappear even when a reading operation has been completed, as already described above. In order to input new optical information, therefore, it is necessary to carry out a refreshing operation for the purpose of causing the charges which have been accumulated to disappear. At the same time, the p-region 6, which is left floating, must be charged so that the potential thereof is a predetermined negative voltage.

Figure 4A:
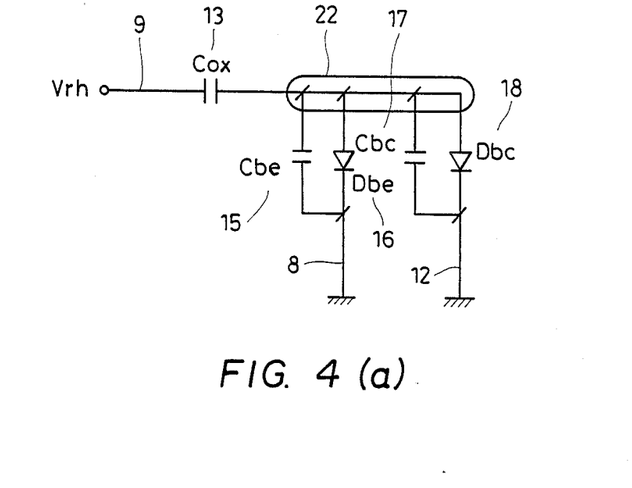
FIG. 4(a) is a diagram showing an equivalent circuit of the photosensor cell during a refreshing operation.

With the photosensor cell arranged as described above, the refreshing operation is effected by applying a positive voltage to the electrode 9 through the electrode 10 in the same manner as in the case of the reading operation. At this time, the emitter is grounded through the electrode 8, while the collector is held at either ground potential or a positive potential through the electrode 12. FIG. 4(a) shows an equivalent circuit for analyzing the refreshing operation, the circuit comprising an example in which the collector side is grounded.

When, in this state, a positive voltage Vrh is applied to the electrode 9, the voltage shown below is momentarily applied to the base 6 in a manner similar to that in the aforementioned reading operation as a result of capacitance division effected by the oxide layer capacitance Cox13, the base-emitter junction capacitance Cbe15 and the base-collector junction capacitance Cbc17:

$$\frac{Cox}{Cox + Cbe + Cbc} Vrh$$

This voltage causes the base-emitter junction diode Dbe16 and the base-collector junction diode Dbc18 to be forward-biased and thereby made conductive, so that a current starts to flow, and the base potential gradually lowers.

Figure 4B:
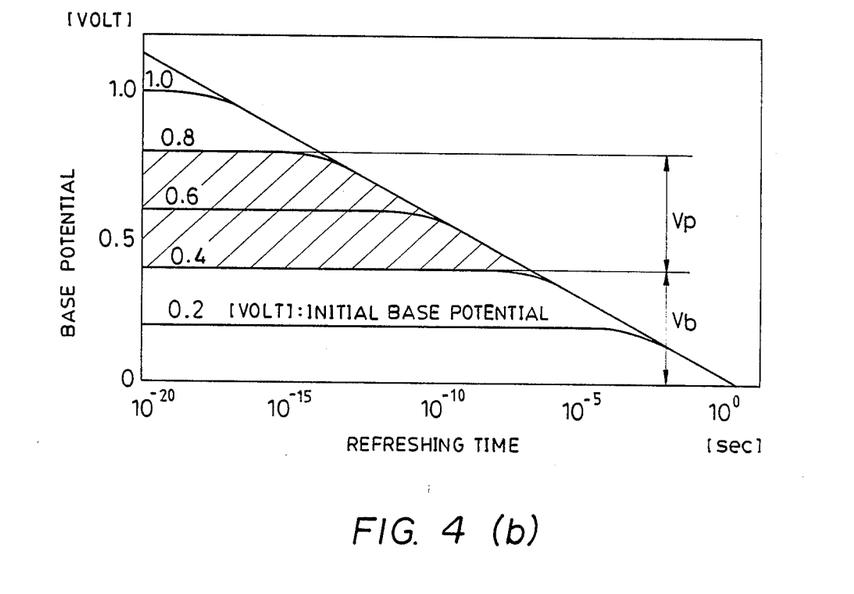
FIG. 4(b) is a graph showing changes in the base potential with respect to the refreshing time.

FIG. 4(b) shows the results of calculation carried out with respect to changes in the potential of the base 22 which is in a floating state at the time of refreshing operation, as one example of the dependence of the base potential on time. The axis of abscissa of the graph shown in FIG. 4(b) represents the refreshing time, that is, the elapse of time from the moment the refreshing voltage Vrh is applied to the electrode 9, while the axis of ordinate represents the base potential, and the initial base potential is employed as a parameter. The initial base potential is a potential at the floating base which is measured when the refreshing voltage Vrh is applied to the electrode 9 and which is determined by Vrh, Cox, Cbe, Cbc and the charges which have been accumulated in the base.

It will be understood from FIG. 4(b) that the base potential invariably lowers along one straight line on the semi-logarithmic graph after a certain period of time has elapsed irrespective of the level of the initial base potential.

There are two methods or operations of removing any positive voltage at the p-region 6 by applying a positive voltage through the MOS capacitor Cox for a certain period of time and thereby charging the p-region 6 to a negative potential. One of them is an operation in which negative charges are accumulated in the p-region 6 as the result of the holes having positive charges flowing out from the p-region 6 into the n-region 1 which is mainly held in a grounded state.

The other operation of accumulating negative charges in the p-region 6 is effected by the electrons which flow out from the n+-region 7 and the region 1 into the p-region 6 and recombine with the holes therein.

A solid-state image sensor which is constituted by photosensor cells having the arrangement described above involves two modes, that is, a complete refreshing mode in which the base potentials of all the cells are brought to zero voltage by a refreshing operation (in this case, $10^0$ sec, i.e., one second is needed in the example shown in FIG. 4(b)), and a transient refreshing mode in which the variable component of the base potential which depends upon the accumulated charge voltage Vp disappears although a predetermined voltage remains (in this case, a refreshing pulse of 10 μsec (microseconds) to $10^0$ sec, i.e., one second is generated in the example shown in FIG. 4(b)).

Whether the image sensor is to be operated in the complete refreshing mode or in the transient refreshing mode is determined in accordance with the purpose of use of the device.

The basic operation of the photosensor cell in accordance with the above-described arrangement is thus constituted by the charge accumulating operation effected by irradiation with light, the reading operation and the refreshing operation. Accordingly, it is possible to observe incident light or read out optical information with each of the operations employed as a basic cycle.

As has been described above, the basic structure of the above-described photosensor cell is extremely simple compared with those of the image sensors which are described in Japanese Patent Laid-Open specifications Nos. 150878/1981, 157073/1981 and 165473/1981, respectively. It is therefore possible for the photosensor cell to satisfactorily cope with any need to increase resolution. In addition, the photosensor cell preserves the merits of the devices disclosed in those specifications which are offered by virtue of the amplifying function that is an excellent feature thereof, such as a lowered level of noise, an increased output, a widened dynamic range, a non-destructive reading operation, etc.

SUMMARY OF THE INVENTION

It is a primary object of the present invention to provide an optical signal processor which enables any desired information to be written into a photoelectric transducer of the type described above, thereby allowing optical information to be superposed on any other desired information and vice versa.

To this end, one embodiment of the optical signal processor according to the present invention comprises a plurality of base regions, and a gate electrode provided through an insulating layer in order to interconnect signals in the base regions, wherein an optical signal is accumulated in a given base region. It is therefore possible, according to the present invention, to write and read any desired information in the form of either an optical signal or an electric signal alone or information in the form of both of them in a superposed manner. Thus, the present invention may be applied to, for example, a memory and a processor of an optical computer, and an image sensor in which cells are arranged in a matrix.

The invention in one aspect comprises a photosensor which converts an optical signal to an electrical signal and which has a semiconductor base which accumulates a converted electrical signal. The photosensor is constructed to amplify and read out the converted electrical signal accumulated in its base. An input means is connected to introduce another electrical signal to the base, and a storage means is connected between the input means and the base for temporarily storing the signal which is introduced thereto from the input means.

According to a further aspect of the invention, there is provided a photosensor cell formed on a semiconductor substrate. A first MOS channel is connected to introduce charges to the photosensor cell and a semiconductor region is connectable to the photosensor cell through the first MOS channel. A second MOS channel is connected to introduce a charge to the semiconductor region and a charge input means is connectable to the semiconductor region through the second MOS channel.

The above and other objects, features and advantages of the present invention will become clear from the following description of the preferred embodiment thereof, taken in conjunction with the accompanying drawings.

DETAILED DESCRIPTION OF THE PREFERRED EMBODIMENT

Figure 5:
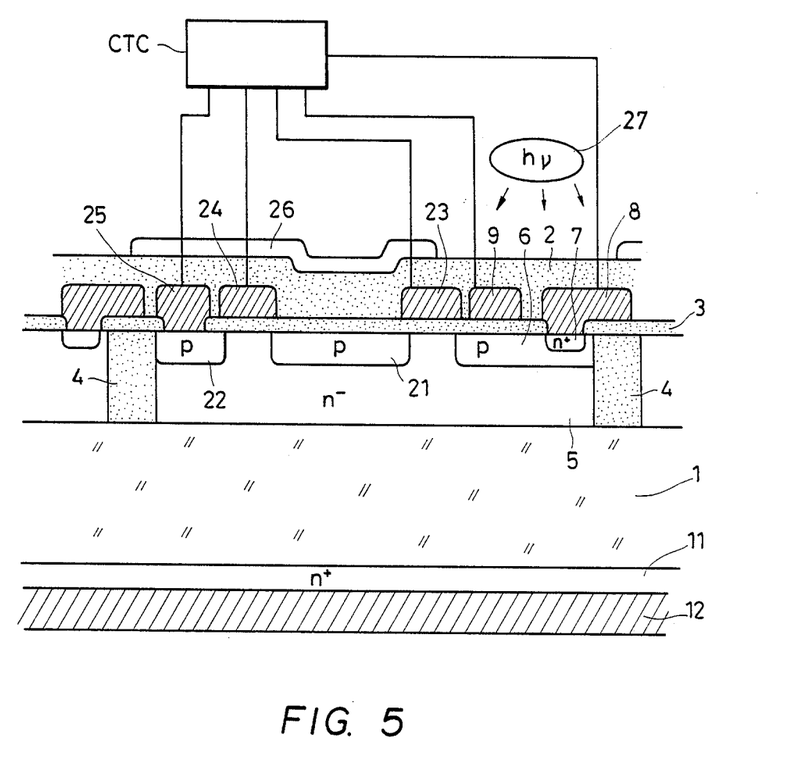
FIG. 5 is a sectional view of one embodiment of the present invention.

Referring to FIG. 5, which is a sectional view of one embodiment of the present invention, reference numerals 21 and 22 denote p-regions or base regions, while the numeral 23 represents a gate electrode. An MOS transistor is constituted by the gate electrode 23, an $n^-$-region 5, a p-region 6, an insulating oxide layer 3 and the p-region 21. The reference numeral 24 denotes another gate electrode which, together with the $n^-$-region 5, the base regions or p-regions 21, 22 and the insulating oxide layer 3. An electrode 25 is provided for the purpose of writing a signal or resetting the base potential. In addition, a light-shielding layer 26 made of, e.g., aluminum (Al), is provided so as to shield all portions except for the light-sensitive or light-receiving portion.

The embodiment further comprises: a passivation layer 2; an insulating oxide layer 3 constituted by a silicon oxide layer; element-isolating regions 4 constituted by an insulating layer, a polysilicon layer or the like for effecting electrical insulation between photosensor cells which are adjacent to each other; an $n^+$-region 7 which constitutes the emitter of a bipolar transistor; an electrode 8 formed of an electrically conductive material such as aluminum (Al) for reading out a signal to an external device; a capacitor electrode 9 which faces the p-region 6 across the insulating layer 3 to apply a pulse to the p-region 6 which is left floating; an n+-region 11 formed on the reverse surface of the substrate 1 for the purpose of forming an ohmic contact; and an electrode 12 for applying a potential to the collector of the bipolar transistor. The bipolar transistor is constituted by the n+-region 7 which serves as the emitter, the p-region 6 as the base, and the n⁻-region 5 and the region 1 as the collector. In addition, the reference symbol CTC denotes a control circuit which applies a voltage to each of the electrodes 8, 9 and 23 to 25.

The following is a description of a first example of the operation of the arrangement detailed above which takes place when a desired electric information is superposed on the information which has already been accumulated by reception of light.

It is assumed that, in the bipolar transistor which is constituted by the p-region 6 as the base, the n+-region 7 as the emitter, and the n⁻-region 5 and the region 1 as the collector, the emitter is grounded through the electrode 8, while the collector is biased to a positive potential through the electrode 12, and the base is reverse-biased with respect to the emitter in advance.

In this set of conditions, when light 27 is applied to the photosensor from the obverse side thereof, as shown in FIG. 5, electron-hole pairs are generated within the semiconductor material. Of the pairs, the electrons flow out toward the n-region 1 since this region is biased to a positive potential, but the holes are gradually accumulated in the p-region or base 6.

Then, a negative voltage is applied to the gate electrode 24, and a desired voltage is applied to the p-region or base region 22 through the electrode 25. Thereafter, the gate electrode 24 is brought to zero potential, whereby a charge amount corresponding to the voltage applied to the p-region or base region 22 is accumulated in the p-region or base region 21.

Then, a negative voltage is applied to the gate electrode 23. As a result, the charges accumulated in the p-region 21 and those accumulated in the p-region 6 move through a channel generated within the region 5 and are divided so that a charge amount which corresponds to the capacitance of each of the base regions 21 and 6 is accumulated therein. Thereafter, the gate electrode 23 is brought to zero potential. In consequence, the p-regions or base regions 6 and 21 are isolated from each other, whereby a desired charge amount which corresponds to the desired voltage applied to the p-region 22 is accumulated in the p-region 6 in such a manner as to be superposed on the charges already accumulated therein by the reception of light. The readout of the charges, i.e., (information) thus accumulated in the p-region 6 is effected in a manner similar to that in the aforementioned example. More specifically, the emitter and the electrode 8 are placed in a floating state, while the collector and the base are held at a positive potential and a predetermined bias voltage, respectively, and a readout voltage is applied to the electrode 9.

The refreshing operation will be explained below.

When negative voltages are applied to the gate electrodes 24 and 23 at the same time and a reference voltage for refreshing is applied to the p-region 22 through the electrode 25, the p-region 6 and the p-regions or base regions 21 and 22 are refreshed in a manner similar to that described above.

Figure 6:
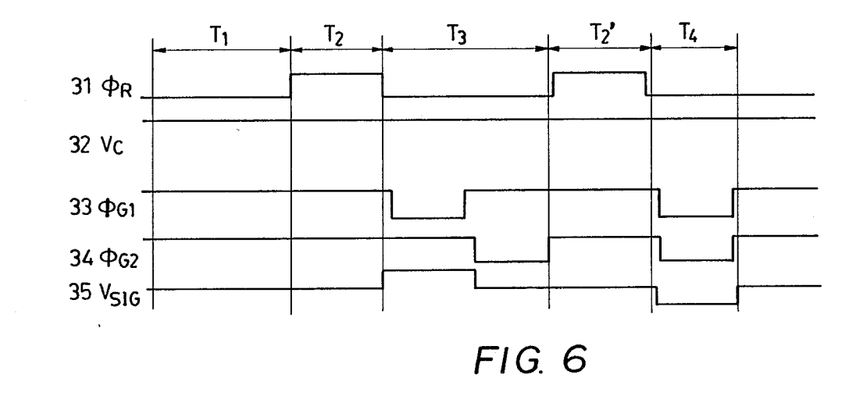
FIGS. 6 and 7 are charts showing waveforms at various portions of the embodiment in writing mode.

The above-described operation is shown by the timing chart of FIG. 6, in which: $31\phi_R$ represents READ (readout) pulses applied to the capacitor electrode 9; $32V_C$ a collector voltage applied to the electrode 12; $33\phi_{G1}$ gate pulses applied to the gate electrode 24; $34\phi_{G2}$ gate pulses applied to the gate electrode 23; and $35V_{SIG}$ a signal voltage applied to the p-region 22 through the electrode 25. In addition, the reference symbol $T_1$ denotes a light-receiving period; $T_2$ and $T_2'$ reading periods; $T_3$ a writing period; and $T_4$ a refreshing period.

The following is a description of a second example of the operation of the optical signal processor in which a charge amount which corresponds to a signal input to the p-region 22 is accumulated in the p-region 6 in advance, and then, a charge amount generated by the photoelectric conversion is added to the charges already accumulated.

For example, the emitter is grounded through the electrode 8, and the collector is biased to a positive potential through the electrode 12 in advance. The base (the p-region 6) and the p-region 21 are assumed to be reverse-biased with respect to the emitter (i.e., the region 7).

In this state, a negative voltage is applied to the gate electrode 24 and, at the same time, a signal voltage is applied to the p-region 22 through the electrode 25. When the gate electrode 24 is brought to zero voltage thereafter, the charges accumulated in the p-region 21 are divided in proportion to the respective capacitances of the p-regions 21 and 6 and are accumulated in these regions, respectively.

When light to is then applied to the photosensor, charges generated by photoelectric conversion are accumulated in the p-region 6 in such a manner that they are superposed on the charges which have already been accumulated therein. Then, a negative voltage is applied to the gate electrode 23 again and, thereafter, the gate electrode 23 is brought to zero voltage. As a result, the superposed charges are divided into the p-regions 21 and 6 and accumulated therein. The reading and refreshing operations in this case are similar to those in the aforementioned example of the operation.

Figure 7:
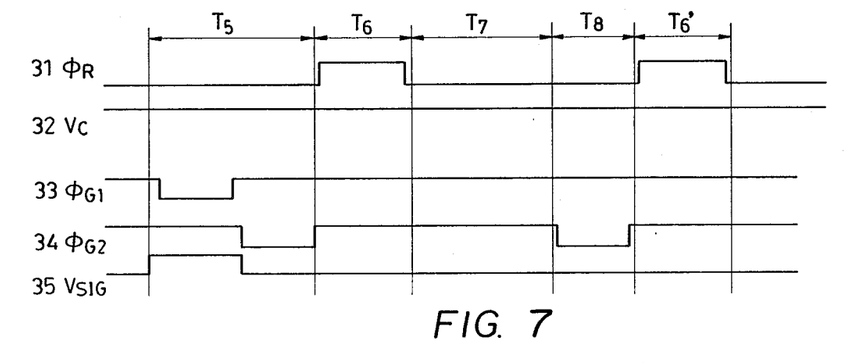

The above-described second example of the operation of the optical signal processor is shown by the timing chart of FIG. 7, in which: the reference symbol $T_5$ represents a writing period; $T_6$ and $T_6'$ reading periods; $T_7$ a light-receiving period; and $T_8$ an adding period.

Calculation examples in which the above-described first and second examples of the operation are employed are given below.

It is assumed that the respective capacitances of the p-regions 21 and 6 in the arrangement shown in FIG. 5 are represented by $C_{21}$ and $C_6$. A negative voltage $V_S$ is applied to the gate electrode 24, and a voltage $V_S$ is applied to the region 22 through the electrode 25, and thereafter, the gate electrode 24 is brought to zero potential. At this time, the amount of charges $Q_S$ accumulated in the p-region 21 is given by $$Q_S = C_{21} V_S \tag{1}$$

The amount of charges Ql accumulated in the p-region 6 by photoelectric conversion may be expressed by $$Ql = K \times F(\lambda, l, t) \tag{2}$$

where
K: intrinsic value of the sensor

λ: single wavelength of incident light
l: illuminance
t: irradiation time

In the first example, if light is applied under conditions of a single wavelength of $\lambda_1$, an illuminance of $l_1$ and an irradiation time of $t_1$, and the signal voltage for writing information into the region 22 is $V_{S1}$, then the amount of charges $Q_{01}$ which have been accumulated in the p-region 6 at the time when the period $T_3$ (see FIG. 6) has ended may be given by $$Q_{01} = \frac{C_6}{C_{21} + C_6} (C_{21}V_S + K \times F(\lambda_1, l_1, t_1)) \quad (3)$$

In the second example of the operation, the amount of charge $Q_{02}$ which has been accumulated in the p-region 6 when the period $T_8$ (see FIG. 7) has ended with the same incident light and signal voltage as those in the above may be given by $$Q_{02} = \frac{C_6}{C_{21} + C_6} (C_{21}V_S + K \times F(\lambda_1, l_1, t_1)) \quad (4)$$

Thus, the equations (3) and (4) are coincident with each other.

In other words, it is possible to add light and a voltage together, although there is a difference in procedure between the first and second examples of the operation.

What is claimed is:

1. An optical signal processor comprising:
   (a) a photosensor which converts an optical signal to an electrical signal, said photosensor having a semiconductor base which accumulates the converted electrical signal, and said photosensor being constructed to amplify and read out the converted electrical signal accumulated in said base;
   (b) input means for introducing another signal to said base;
   (c) storage means connected between said input means and said base for temporarily storing the signal which is introduced thereto from said input means; and
   (d) control means for mixing the signal stored in said storage means with the electrical signal in said photosensor while making said input means inoperative.

2. An optical signal processor according to claim 1, wherein said input means has an MOS structure.

3. An optical signal processor according to claim 1, wherein said storage means has an MOS structure.

4. An optical signal processor according to claim 1, wherein said photosensor has the structure of a bipolar transistor.

5. An optical signal processor comprising:
   (a) charge accumulating means for accumulating charges generated by photoelectric conversion;
   (b) charge input means for introducing another signal to said charge accumulating means;
   (c) storage means provided between said charge accumulating means and said charge input means for temporarily storing the signal which is input thereto from said charge input means; and
   (d) control means for mixing the signal stored in said storage means with the charges accumulated in said charge accumulating means while making said charge input means inoperative.

6. An optical signal processor according to claim 5, wherein said charge input means has an MOS structure.

7. An optical signal processor according to claim 5, wherein said storage means has an MOS structure.

8. An optical signal processor according to claim 5, wherein said charge accumulating means includes a bipolar transistor which accumulates in the base region thereof charges generated by photoelectric conversion.

9. An optical signal processor according to claim 5, further comprising:
   (d) first gate means provided between said charge input means and said storage means.

10. An optical signal processor according to claim 5, further comprising:
    (e) second gate means provided between said storage means and said charge accumulating means.

11. An optical signal processor comprising:
    (a) a photosensor cell formed on a semiconductor substrate;
    (b) a first MOS channel for introducing charges to said photosensor cell;
    (c) a semiconductor region connectable to said photosensr cell through said first MOS channel;
    (d) a second MOS channel for introducing a signal to said semiconductor region; and
    (e) charge input means connectable to said semiconductor region through said second MOS channel.

12. An optical signal processor according to claim 11, wherein said photosensor cell includes a phototransistor.

13. An optical signal processor according to claim 12, wherein said phototransistor accumulates a signal in the base region thereof.

* * * * *

UNITED STATES PATENT AND TRADEMARK OFFICE
CERTIFICATE OF CORRECTION

PATENT NO. : 4,737,832

DATED : April 12, 1988

INVENTOR(S) : KENJI KYUMA

It is certified that error appears in the above-identified patent and that said Letters Patent is hereby corrected as shown below:

COLUMN 1

Line 13, "FIGS 2a and 2b and equivalent circuits" should read --FIGS 2a and 2b are equivalent circuits--.

Line 27, "subtrate" should read --substrate--.

COLUMN 2

Line 19, "charges" should read --charge--.

Lines 56-57, "$V_b + V_p + \dfrac{C_{ox}}{C_{ox} + C_{be} + C_{bc}} V_r.$" should read --$-V_b + V_p + \dfrac{C_{ox}}{C_{ox} + C_{be} + C_{bc}} V_r.$--

COLUMN 6

Line 51, after "which" insert --constitutes another MOS transistor--.

COLUMN 7

Line 13, "a" should be deleted.

COLUMN 8

Line 30, "to" should read --27--.

UNITED STATES PATENT AND TRADEMARK OFFICE
CERTIFICATE OF CORRECTION

PATENT NO. : 4,737,832

DATED : April 12, 1988

INVENTOR(S) : KENJI KYUMA

It is certified that error appears in the above-identified patent and that said Letters Patent is hereby corrected as shown below:

<u>COLUMN 10</u>

Line 41, "sensr" should read --sensor--.

Signed and Sealed this

Twenty-second Day of November, 1988

Attest:

DONALD J. QUIGG

Attesting Officer

Commissioner of Patents and Trademarks